United States Patent [19]
Brault et al.

[11] Patent Number: 5,895,441
[45] Date of Patent: Apr. 20, 1999

[54] LEARNING PROXIMITY DETECTOR

[75] Inventors: Christophe Brault, Champniers; Stéphane Even, Angouleme; Patrick Durand, Rouillac, all of France

[73] Assignee: Schneider Electric SA, Boulogne Billancourt, France

[*] Notice: This patent issued on a continued prosecution application filed under 37 CFR 1.53(d), and is subject to the twenty year patent term provisions of 35 U.S.C. 154(a)(2).

[21] Appl. No.: 08/638,534

[22] Filed: Apr. 26, 1996

[30] Foreign Application Priority Data

Apr. 28, 1995 [FR] France ................... 95 05253

[51] Int. Cl.$^6$ ..................................................... G01R 27/00
[52] U.S. Cl. ................................. 702/85; 324/644
[58] Field of Search ............... 364/571.01; 324/644, 324/629–646, 207, 225, 327; 367/107, 99

[56] References Cited

U.S. PATENT DOCUMENTS 5,229,975 7/1993 Truesdell et al. ............... 367/107
5,633,593 5/1997 Wolff et al. ..................... 324/644

FOREIGN PATENT DOCUMENTS 0 090 182 10/1983 European Pat. Off. .
43 31 555 3/1994 Germany .

Primary Examiner—John Barlow
Assistant Examiner—Kamini Shah
Attorney, Agent, or Firm—Oblon, Spivak, McClelland, Maier & Neustadt, P.C.

[57] ABSTRACT

A proximity detector including a sensor unit that produces an analog signal and a processor circuit digitizing this signal. The processor circuit includes logic that determines a switching value from an initial value and an extreme value obtained during a learning mode.

26 Claims, 2 Drawing Sheets

LEARNING PROXIMITY DETECTOR

BACKGROUND OF THE INVENTION

1. Field of the Invention

The present invention concerns a proximity detector of the inductive, photoelectric or any other type, comprising a sensor unit adapted to deliver an analogue detection signal according to the range of a target and an electronic processor circuit connected to an output stage that delivers a signal indicating the presence or the absence of a target according to whether the range of the target is less than or greater than a switching distance.

2. Discussion of the Background

The switching distance specific to a detector of this kind varies from one equipment to another and, for the same equipment, with its installation or environmental conditions, in particular in the case of an inductive detector embedded in a mass of metal or a photoelectric cell operating with a bright background.

It would therefore be useful to be able to calibrate the proximity detector in situ.

It has previously been proposed (see document DE-43 31 555) to calibrate a proximity detector in the factory or on the user's premises using control logic to which a non-volatile memory and a counter are connected. An object is placed at a predetermined fixed distance from the detector and counting is started when the logic is activated by a calibration signal; the count value is passed through a digital-to-analogue converter and then compared with the value of the detected signal; as soon as it reaches this value, the count is stopped and the corresponding value is placed in memory. However, a device of this kind cannot be used with a target that moves during the calibration phase.

SUMMARY OF THE INVENTION

An aim of the invention is to calibrate the switching point of a proximity detector by dynamically analysing the movement of the target to be detected, in a reliable manner that allows great flexibility of adaptation to the user's site.

Another aim of the invention is to enable the detector to be calibrated regardless of whether the moving target is initially nearby or far away, by dynamically analyzing this movement and to enable the detector to be recalibrated in the same way in operation, if necessary.

In accordance with the invention, the processor circuit includes means for digitizing the analog signal and acquisition and calculation means included in logic controlled by a learning signal, the acquisition and calculation means being used in a learning phase and acquiring at the start of the learning phase an initial value $v_0$ of the digital detection signal indicative of an initial position of the target, acquiring during the learning phase an extreme value $v_m$ of said signal indicative of an intermediate state of the target and calculating a switching value $v_c$ according to the initial value $v_0$ and the extreme value $v_m$, the logic defining the end of the learning phase when the value of the detection signal is indicative of return of the target to a state near its initial state, preferably according to the difference between them and the sign of the latter difference.

The learning phase starts from the first application of the supply voltage to the detector, preferably with a slight time-delay, or when an external control signal is applied to a terminal of the detector.

The calibration already carried out is not altered when the detector is powered up again.

The processing logic includes validation means that, firstly, determine the end of the learning phase and validate the calibration when the detection signal reaches a final value close to the initial value and, secondly, invalidate the calibration if the extreme value remains within a blind area.

BRIEF DESCRIPTION OF THE DRAWINGS

The following description of one non-limiting embodiment, given with reference to the accompanying drawings, illustrates the features and the advantages of the invention in which.

DESCRIPTION OF THE PREFERRED EMBODIMENTS

Figure 1:
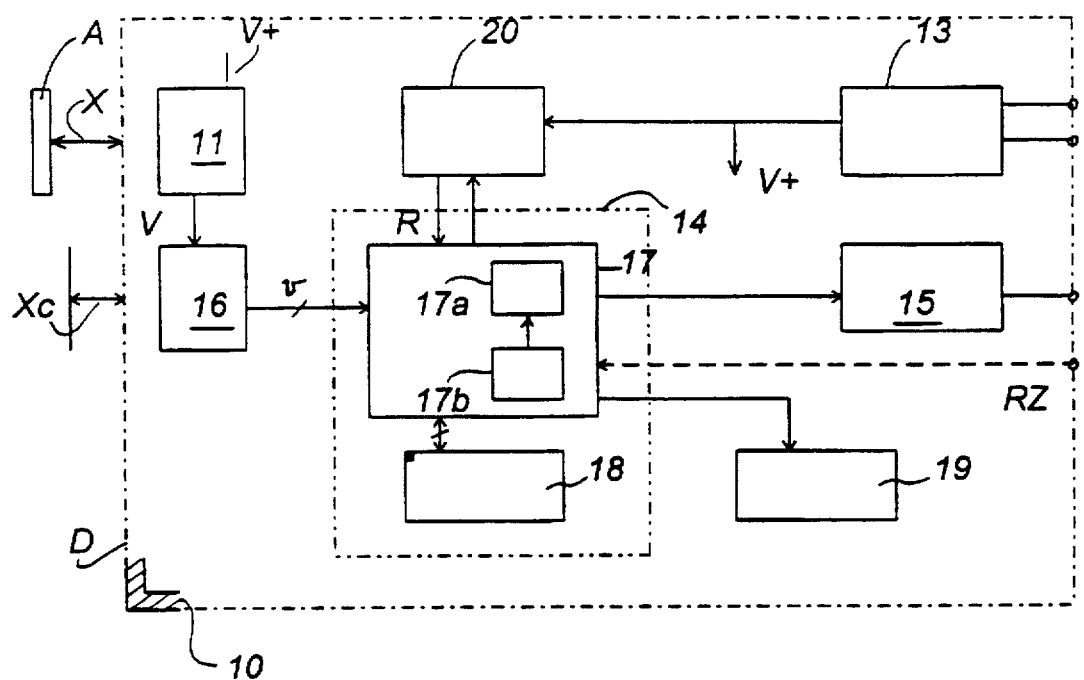
FIG. 1 shows a proximity detector of the invention in the form of a block diagram.

The proximity detector D shown in FIG. 1 comprises in a casing 10 a sensor unit 11 that can be of any of the usual types: inductive, capacitive, photoelectric, ultrasonic or the like, and which delivers an analog detection value, in the case of the present invention a voltage V, which is indicative of the range X of an object or target A.

The casing 10 of the detector includes terminals 12 for external connection to a power supply and to a load, and possibly to an external calibration control device. The casing also contains a power supply unit 13, an electronic processor circuit 14 and an output stage 15.

The power supply unit 13 derives from the external supply voltage a voltage $V^+$ supplying the sensor unit and supply voltages for the other components of the detector. The input of the electronic processor circuit 14 is connected to digitiser means 16, for example an analog-to-digital converter, for converting the analog voltage supplied by the sensor unit into a digital signal v. The processor circuit 14 includes processor logic 17 and a non-volatile memory 18 that can be erased and rewritten, for example an EEPROM or like memory.

The digital value v from the converter 16 is applied to the input of the logic 17. The latter comprises hardwired logic, a microcontroller or a microprocessor, for example, and is connected to the EEPROM 18 so that it can write and read therein a digital reference value corresponding to the switching distance.

The proximity detector and its processor logic 17 in particular are designed to operate in a learning mode in which the switching value specific to the detector is written into the memory in situ and a detection mode in which this same value is read out from the memory.

The expression "learning mode" refers to a mode of operation in which, while the target is in motion, i.e. moving closer and then further away—or further away and then closer—the detector acquires a plurality of digital detection values characteristic of the target and determines from these the digital switching value $v_c$ that is then stored in the memory 18. In the detection mode the detector samples the digital value and compares it with the value in memory to deliver the signal indicating absence or presence of a target.

The processor logic is connected to a display device 19, for example at least one light-emitting diode, adapted to give different luminous indications in the learning mode and in the detection mode. The power supply unit 13 is connected to an initialization circuit 20 in turn connected to the logic 17 to apply to the latter a reset signal R that initializes the learning phase when the supply voltage is applied to the detector for the first time. As shown in dashed line in FIG. 1, the learning phase can also be initialized during operation by having the processor logic apply a reset to zero signal RZ to one of the terminals 12 connected to the logic and to an external bus or conductor.

The processor logic 17 includes means 17a for acquiring and calculating various digital values and means 17b for validating some of these values. The logic is connected to the output stage 15 to which it delivers a signal which is amplified to produce an output signal S available at the terminals 12. As already mentioned, depending on the value of v relative to $v_c$ in the detection mode, the signal S has a first level when the range X of the target A is greater than a switching distance $X_c$ and a second level when $X<X_c$.

Figure 2:
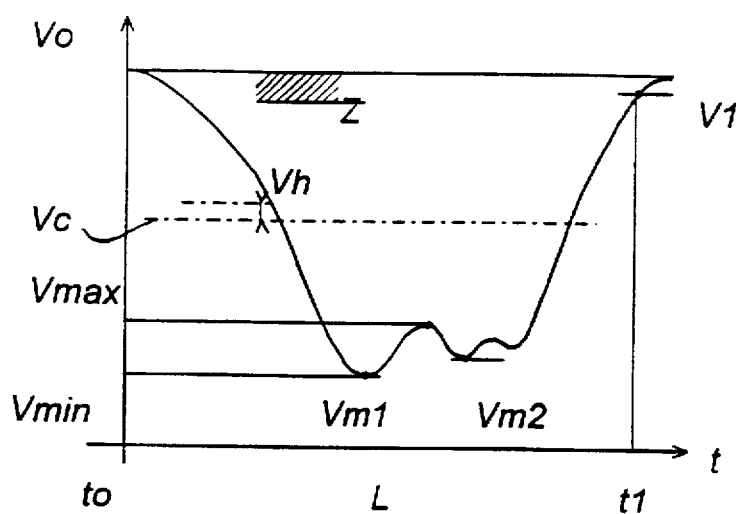
FIG. 2 is a diagram showing the variation of the analog detection signal during a learning operation in the case where the target is far away at the start of the learning operation.
Figure 3:
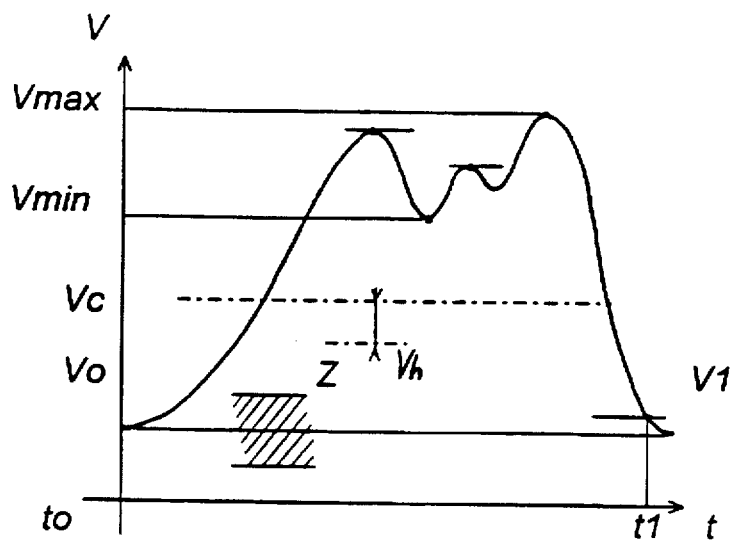
FIG. 3 is a similar diagram in the case where the target is nearby at the start of the learning operation.

FIGS. 2 and 3 show two different learning modes, respectively with the target absent and present at the start of the learning phase. These figures are graphs showing the variation in the analog voltage V produced by the sensor unit 11 as a function of time t. The corresponding digital values are denoted v with the respective suffix.

In both cases, the acquisition and calculation means 17a acquire at time $t_0$ an initial digital value $v_0$ (voltage $V_0$) when the reset signal R or the reset to zero signal RZ has been applied to the processor logic 17. During the learning phase the acquisition and calculation means 17a acquire a measured or calculated digital extreme value $v_m$ and then determine the digital switching value $v_c$ on the basis of the learning amplitude difference $v_0-v_m$.

In the FIG. 2 learning mode, the target A being initially far away, the sensor unit 11 initially outputs a maximal voltage $V_0$. The target A moves closer and then farther away, with the result that the voltage falls to a minimal value $V_{min}$ and then rises again to its initial value $V_0$. The extreme value $V_m$ characteristic of the learning operation is either made equal to the corresponding minimal value $V_{min}$ or, if the variation curve V(t) includes one or more peaks due to non-uniform movement of the target, the largest maximal value $V_{max}$ between two minimal values $V_{m1}$, $V_{m2}$, or an appropriate combination of these values. The end $t_1$ of the learning phase is defined when the voltage rises to a threshold value $V_1$ near $V_0$ but slightly below $V_0$, for example 2% less than $V_0$, in order to avoid overheating and drift problems; the corresponding digital value is $v_1$.

The logic 17 preferably calculates the digital switching value $v_c$ using an appropriate function of the amplitude difference $v_0-v_m$ or using a linear function $k_1v_0-k_2v_m$ of the initial value and the extreme value to be stored in the memory 18. The logic 17 also calculates a hysteresis value $v_h$ as a function of the amplitude difference, for example $v_h$ as $0.1(v_0-v_m)$ or as a fraction of $v_c$, this value being also stored in the memory 18. It goes without saying that the memory 18 can store either the values indicated or the values or parameters needed to calculate them.

A threshold $V_s$ locked to the initial value $V_0$ defines a calibration blind area Z such that if at least one of the values acquired or calculated during the learning phase ($v_{min}$, $v_{max}$ or $v_c$) is in this area the validation means 17b invalidate the calibration.

In the FIG. 3 learning mode, the target A is initially near the detector with the result that the sensor unit supplies a minimal value $V_0$ from the start $t_0$ of the learning phase. The target A moves farther away and then closer, with the result that the voltage rises to a maximal value $V_{max}$, possibly via peaks defining a minimal value $V_{min}$ between two successive maximal values, and then falls to its initial value $V_0$. The end $t_1$ of the learning phase is defined when the voltage reaches a value $V_1$ near $V_0$ but slightly below $V_0$. The extreme value $v_m$ is made equal to $v_{max}$ or $v_{min}$ or to a combination of these values and $v_c$ is calculated as before as a function of $v_0$ and $v_m$. The values $v_c$ and $v_h$ are stored as previously in the memory 18 if the validation means find that the measurement is not within the calibration blind area Z.

Figure 5:
FIG. 5 is a flowchart of the calculation distinguishing a target that is initially nearby from a target that is initially far away.

The logic 17 determines automatically if the value $V_c$ is to be calculated by considering whether the target is initially far away or nearby. The processing sequence carried out by the logic then comprises the following steps (see FIG. 5): acquisition of values $v_0$ and $v_{m1}$, $v_{m2}$ (step 40), analysis of the parameters to designate the target as initially nearby or far away (step 41), and calculation of the switching value $v_c$ in the appropriate manner, i.e. taking account of the target designation in step 41 (step 42).

Figure 4:
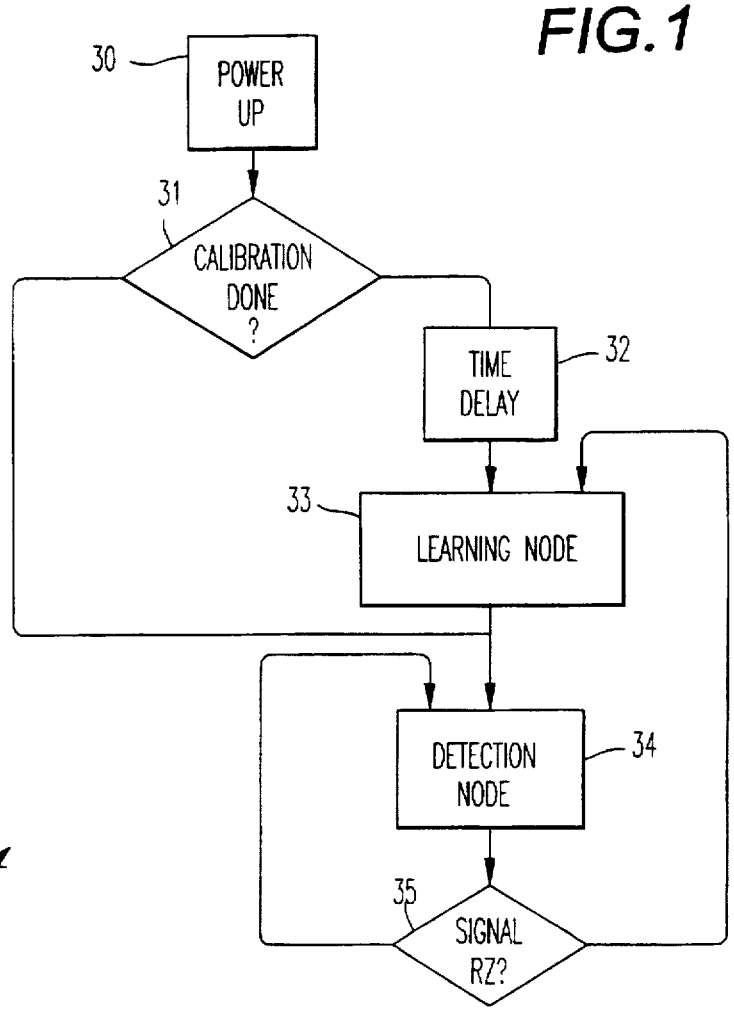
FIG. 4 is a flowchart showing the operation of the detector.

The operation of the detector of the invention for a target that is initially far away is explained below with reference to the figures, and in particular with reference to FIG. 4.

An operating sequence begins when the detector 30 is powered up. Depending on whether the answer to the question "calibration done?" in step 31 is "yes" or "no", the processor logic operates after a time-delay 32 to carry out a detection mode sequence 34 or a learning mode sequence 33. In the latter case, the detector is switched to the detection mode immediately after the learning phase is completed and validated. The learning signal RZ can be applied at any time (35) to switch from the detection mode to the learning mode and to start a new learning phase leading to recalibration of the detector.

When the power supply is connected to the terminals 12 the supply voltage of the sensor unit 11 rises to $V^+$ and the output voltage of the sensor unit reaches the value $V_0$. At the end of a 100 ms time-delay, for example, the circuit 20 supplies the signal R to the processor logic.

The acquisition and calculation means 17a acquire the initial digital value $v_0$ from the converter 16 and the logic 17 causes a diode of the display device 19 to flash on and off. The target A moves towards the detector, with the result that the sensor unit output voltage varies as shown in FIG. 2. The acquisition and calculation means 17a acquire the intermediate value $v_{max}$ or $v_{min}$ and deduce from it the extreme value $v_m$. They then calculate the value $v_c$ as a function of $v_0$ and $v_m$. The validation means validate this value if the extreme value is outside the blind area Z; the calibration operation must be started again if this is not the case.

When the voltage V reaches the value $V_1$ near the initial value $V_0$, the validation means define the end of the learning phase and the switching value $v_c$ and the hysteresis value $v_h$ are stored in the EEPROM 18. The detector then switches to the detection mode 34 and the display device stops flashing on and off to indicate the switching state; when a target moves closer the minimal value of the voltage that is then obtained is compared with the value $v_c$ read out from the memory and as a result the processor circuit generates a signal indicating the presence of an object.

Note that the duration $t_1-t_0$ of the learning phase is not fixed and is determined by the manner in which the target moves closer and farther away.

We claim:

1. A proximity detector comprising:

a sensor unit sensing a range of a target and outputting an analog signal depending on the sensed range of the target;

an electronic processor circuit receiving the analog signal from the sensor unit and connected to an output stage that produces a signal indicative of a presence or an absence of a target according to whether the sensed range of the target is less than or greater than a switching distance;

the processor circuit operating in a learning mode during which the target is moved and in a detection mode and including:

a non-volatile memory into which a switching value acquired in the learning mode is written, the switching value being read out from the memory in the detection mode;

means for digitizing the analog signal; and acquisition and calculation means included in logic controlled by a learning signal, the acquisition and calculation means being used in the learning mode and acquiring at a start of the learning mode an initial value of a digital detection signal indicative of an initial position of the target, acquiring during the learning mode as the target is moved an extreme value indicative of an intermediate state of the targets, and calculating a switching value according to the initial value and the extreme value;

the logic defining an end of the learning mode when the value of the detection signal is indicative of a return of the target to a state near the initial position.

2. The proximity detector according to claim 1, wherein the start of the learning mode is a time of a first application of a supply voltage to the proximity detector.

3. The proximity detector according to claim 1, wherein the start of the learning mode is a time of application of an external signal to a terminal of the proximity detector.

4. The proximity detector according to claim 1, wherein the processor circuit further includes validation means for validating the acquisition and calculation means when the extreme value is outside a calibration blind area.

5. The proximity detector according to claim 1, wherein the processor logic is connected to a display device for providing a visual distinction between the learning mode and the detection mode.

6. The proximity detector according to claim 1, wherein the processor logic determines in the learning mode a digital hysteresis value dependent on the initial value and the extreme value and that is stored in the non-volatile memory.

7. A proximity detector comprising:

a sensor unit sensing a range of a target and outputting an analog signal depending on the sensed range of the target;

an electronic processor circuit receiving the analog signal from the sensor unit and connected to an output stage that produces a signal indicative of a presence or an absence of a target according to whether the sensed range of the target is less than or greater than a switching distance;

the processor circuit operating in a learning mode during which the target is moved and in a detection mode and including:

a non-volatile memory into which a switching value acquired in the learning mode is written, the switching value being read out from the memory in the detection mode;

means for digitizing the analog signal; and acquisition and calculation means included in logic controlled by a learning signal, the acquisition and calculation means being used in the learning mode and acquiring at a start of the learning mode an initial value of a digital detection signal indicative of an initial position of the target, acquiring during the learning mode as the target is moved an extreme value indicative of an intermediate state of the target, and calculating a switching value according to the initial value and the extreme value;

the logic defining an end of the learning mode when the value of the detection signal is indicative of a return of the target to a state near the initial position;

wherein the acquisition and calculation means calculates the switching value according to a difference between the initial value and the extreme value of the digital signal and a sign of this difference, and adapts the calculation to the initial value of the target.

8. The proximity detector according to claim 7, wherein the start of the learning mode is a time of application of an external signal to a terminal of the proximity detector.

9. The proximity detector according to claim 7, wherein the processor circuit further includes validation means for validating the acquisition and calculation means when the extreme value is outside a calibration blind area.

10. The proximity detector according to claim 7, wherein the extreme value is a minimal value or a maximal value measured during the learning mode.

11. The proximity detector according to claim 7, wherein the extreme value is a maximal value or a minimal value between two minimal values or respectively maximal values measured during the learning mode.

12. The proximity detector according to claim 7, wherein the processor logic is connected to a display device for providing a visual distinction between the learning mode and the detection mode.

13. The proximity detector according to claim 7, wherein the processor logic determines in the learning mode a digital hysteresis value dependent on the initial value and the extreme value and that is stored in the non-volatile memory.

14. The proximity detector according to claim 7, wherein the start of the learning mode is a time of a first application of a supply voltage to the proximity detector.

15. A proximity detector comprising:

a sensor unit sensing a range of a target and outputting an analog signal depending on the sensed range of the target;

an electronic processor circuit receiving the analog signal from the sensor unit and connected to an output stage that produces a signal indicative of a presence or an absence of a target according to whether the sensed range of the target is less than or greater than a switching distance;

the processor circuit operating in a learning mode during which the target is moved and in a detection mode and including:

a non-volatile memory into which a switching value acquired in the learning mode is written, the switching value being read out from the memory in the detection mode;

means for digitizing the analog signal; and acquisition and calculation means included in logic controlled by a learning signal, the acquisition and calculation means being used in the learning mode and acquiring at a start of the learning mode an initial value of a digital detection signal indicative of an initial position of the target, acquiring during the learning mode as the target is moved an extreme value indicative of an intermediate state of the target, and calculating a switching value according to the initial value and the extreme value;

the logic defining an end of the learning mode when the value of the detection signal is indicative of a return of the target to a state near the initial position;

wherein the extreme value is a minimal value or a maximal value measured during the learning mode.

16. The proximity detector according to claim 15, wherein the start of the learning mode is a time of application of an external signal to a terminal of the proximity detector.

17. The proximity detector according to claim 15, wherein the processor circuit further includes validation means for validating the acquisition and calculation means when the extreme value is outside a calibration blind area.

18. The proximity detector according to claim 15, wherein the processor logic is connected to a display device for providing a visual distinction between the learning mode and the detection mode.

19. The proximity detector according to claim 15, wherein the processor logic determines in the learning mode a digital hysteresis value dependent on the initial value and the extreme value and that is stored in the non-volatile memory.

20. The proximity detector according to claim 15, wherein the start of the learning mode is a time of a first application of a supply voltage to the proximity detector.

21. A proximity detector comprising:

a sensor unit sensing a range of a target and outputting an analog signal depending on the sensed range of the target;

an electronic processor circuit receiving the analog signal from the sensor unit and connected to an output stage that produces a signal indicative of a presence or an absence of a target according to whether the sensed range of the target is less than or greater than a switching distance;

the processor circuit operating in a learning mode during which the target is moved and in a detection mode and including;

a non-volatile memory into which a switching value acquired in the learning mode is written, the switching value being read out from the memory in the detection mode;

means for digitizing the analog signal; and acquisition and calculation means included in logic controlled by a learning signal, the acquisition and calculation means being used in the learning mode and acquiring at a start of the learning mode an initial value of a digital detection signal indicative of an initial position of the target, acquiring during the learning mode as the target is moved an extreme value indicative of an intermediate state of the target, and calculating a switching value according to the initial value and the extreme value;

the logic defining an end of the learning mode when the value of the detection signal is indicative of a return of the target to a state near the initial position;

wherein the extreme value is a maximal value or a minimal value between two minimal values or respectively maximal values measured during the learning mode.

22. The proximity detector according to claim 21, wherein the start of the learning mode is a time of application of external signal to a terminal of the proximity detector.

23. The proximity detector according to claim 21, wherein the processor circuit further includes validation means for validating the acquisition and calculation means when the extreme value is outside a calibration blind area.

24. A proximity detector according to claim 21, wherein the processor logic is connected to a display device for providing a visual distinction between the learning mode and the detection mode.

25. The proximity detector according to claim 21, wherein the processor logic determines in the learning mode a digital hysteresis value dependent on the initial value and the extreme value that is stored in the non-volatile memory.

26. The proximity detector according to claim 21, wherein the start of the learning mode is a time of a first application of a supply voltage to the proximity detector.

* * * * *